United States Patent
Zhou

(10) Patent No.: US 10,856,433 B2
(45) Date of Patent: Dec. 1, 2020

(54) RADIATOR AND ELECTRIC DEVICE

(71) Applicant: Siemens Aktiengesellschaft, Munich (DE)

(72) Inventor: Yan Heng Zhou, Nanjing (CN)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 15/779,885

(22) PCT Filed: Feb. 16, 2016

(86) PCT No.: PCT/CN2016/073878
§ 371 (c)(1),
(2) Date: May 30, 2018

(87) PCT Pub. No.: WO2017/139923
PCT Pub. Date: Aug. 24, 2017

(65) Prior Publication Data
US 2018/0343769 A1   Nov. 29, 2018

(51) Int. Cl.
*H05K 7/20* (2006.01)
*H01L 23/467* (2006.01)
(Continued)

(52) U.S. Cl.
CPC ....... *H05K 7/20145* (2013.01); *H01L 23/467* (2013.01); *H05K 7/20154* (2013.01);
(Continued)

(58) Field of Classification Search
CPC .......... H05K 7/20145; H05K 7/20154; H05K 7/20336; H05K 7/20418; H05K 7/20909;
(Continued)

(56) References Cited

U.S. PATENT DOCUMENTS 6,334,713 B1 * 1/2002 Chu .................. F16J 15/3268
384/464
6,588,498 B1   7/2003 Reyzin et al.
(Continued)

FOREIGN PATENT DOCUMENTS

CN   2508394 Y   8/2002
CN   1584339 A   2/2005
(Continued)

OTHER PUBLICATIONS

International Search Report PCT/ISA/210 for International Application No. PCT/CN2016/073878 Dated Feb. 16, 2016.
(Continued)

*Primary Examiner* — Mandeep S Buttar
(74) *Attorney, Agent, or Firm* — Harness, Dickey & Pierce, P.L.C.

(57) ABSTRACT

A radiator includes a radiating part including a housing and a set of blades arranged on the inner surface of the housing; and a heat conductive part. The heat conductive part includes a shell including a heat conductive surface, configured to be in contact with a heat source, and a receiving section with two open ends. The receiving section is configured to receive the radiating part. In an embodiment, the radiating part is rotatablely fixed on the receiving section of the heat conductive part such that, when the radiating part rotates, fluid can be drawn into one end of the receiving section and then blown out at the other end by the blades. The radiating part is able to exchange heat constantly with new fluid and the rotation of the blades can expel the fluid with higher temperature and draw in fluid with lower temperature to perform new heat exchange.

16 Claims, 4 Drawing Sheets

(51) Int. Cl.
*H01L 23/427* (2006.01)
*H01L 23/473* (2006.01)

(52) U.S. Cl.
CPC ..... *H05K 7/20336* (2013.01); *H05K 7/20418* (2013.01); *H05K 7/20909* (2013.01); *H01L 23/427* (2013.01); *H01L 23/473* (2013.01)

(58) Field of Classification Search
CPC ........... H05K 7/20272; H05K 7/20609; H05K 7/20263; H05K 7/202; H05K 7/206; H01L 23/467; H01L 2924/0002; H01L 2924/00; H01L 23/367; H01L 23/3675; H01L 2023/405; F28D 15/0266; F28D 15/00; F28D 1/024; G06F 1/20; G06F 1/206; G06F 2200/201; F28F 9/26; F28F 2250/08; F28F 1/128; F28F 9/001
See application file for complete search history.

(56) References Cited

U.S. PATENT DOCUMENTS

| | | | | |
|---|---|---|---|---|
| 6,945,318 | B2* | 9/2005 | Ma | H01L 23/427 165/104.33 |
| 2003/0123227 | A1 | 7/2003 | Chin-Wen | |
| 2005/0042082 | A1 | 2/2005 | Tamagawa et al. | |
| 2006/0056964 | A9 | 3/2006 | Tamagawa et al. | |
| 2006/0082972 | A1* | 4/2006 | Kim | H01L 23/427 361/709 |
| 2006/0185821 | A1* | 8/2006 | Chen | F28D 15/0266 165/80.3 |
| 2010/0195284 | A1* | 8/2010 | Zheng | H01L 23/467 361/697 |
| 2012/0180992 | A1* | 7/2012 | Koplow | F04D 25/0606 165/104.21 |
| 2015/0116928 | A1 | 4/2015 | Delano et al. | |
| 2016/0116232 | A1* | 4/2016 | Koplow | F28D 15/025 165/109.1 |

FOREIGN PATENT DOCUMENTS

| | | |
|---|---|---|
| CN | 203481211 U | 3/2014 |
| DE | 20205305 U1 | 8/2002 |
| JP | 2013202637 A | 10/2013 |
| WO | WO-2012118982 A2 | 9/2012 |
| WO | WO 2015065926 A1 | 5/2015 |

OTHER PUBLICATIONS

Written Opinion of the International Searching Authority PCT/ISA/237 for International Application No. PCT/CN2016/073878 Dated Feb. 16, 2016.
Extended European Search Report for European Patent Application No. 16890158.5 dated Apr. 30, 2019.

* cited by examiner

RADIATOR AND ELECTRIC DEVICE

PRIORITY STATEMENT

This application is the national phase under 35 U.S.C. § 371 of PCT International Application No. PCT/CN2016/073878 which has an International filing date of Feb. 16, 2016, which designated the United States of America, the entire contents of which are hereby incorporated herein by reference.

FIELD

At least one embodiment of present invention is generally related to a radiator and an electric device.

BACKGROUND

In the electric devices which are commercially available, components such as IGBT would generate heat thus becoming a heat source when functioning. To make sure the devices function properly, timely heat dissipation is necessary.

The current heat radiating system is basically consisted of fans and cooling fins, the cooling fins are fixed on the heat source, the fans rotate the air to blow off the heated air around the cooling fins and to bring in new air, thus exchanging heat. To achieve good cooling effect, the cooling fins are generally large.

SUMMARY

Various disclosed embodiments include radiators and electric devices.

At least one embodiment is directed to a radiator. In at least one embodiment, the radiator, comprises:
a radiating part, including
a housing; and
a set of blades which are arranged on the inner surface of the housing,
a heat conductive part, including
a shell, the shell has a heat conductive surface which is configured to be in contact with a heat source; and
a receiving section with two open ends, the receiving section is defined by the shell, and the receiving section is configured to receive the radiating part;
wherein, the radiating part is rotatablely fixed on the receiving section of the heat conductive part, when the radiating part rotates, fluid can be drawn into one end of the receiving section and then blown out at the other end by the blades.

At least one embodiment is further directed to an electric device.

In at least one embodiment, the electric device, includes
a heat source, further including the radiator according to any of the above-mentioned embodiments, the radiator being in contact with the heat source through the heat conductive surface.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

Figure 1:
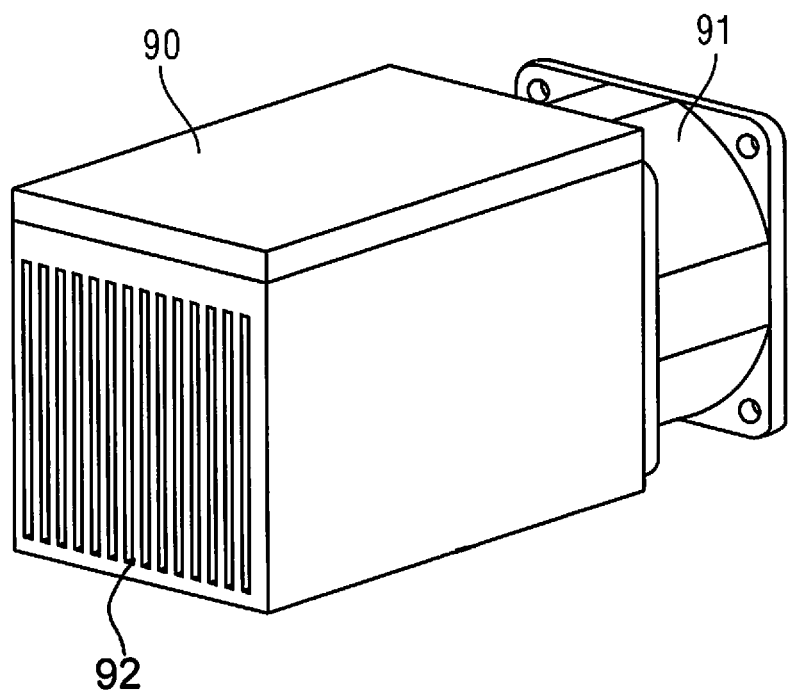
FIG. 1 illustrates a heat dissipation system of the prior art.

The following is a listing of the corresponding reference numerals and the elements of the figures:
10 radiating part
12 housing
13 rotating shaft
14 blades
20 heat conductive part
22 shell
23 heat conductive surface
24 receiving section
30 heat conductive fluid
40 bearing
50 power unit
60 holder
70 heat pipes
90 heat source
91 fans

DETAILED DESCRIPTION OF THE EXAMPLE EMBODIMENTS

In an embodiment a radiator, comprises:
a radiating part, including
a housing; and
a set of blades which are arranged on the inner surface of the housing,
a heat conductive part, including
a shell, the shell has a heat conductive surface which is configured to be in contact with a heat source; and a receiving section with two open ends, the receiving section is defined by the shell, and the receiving section is configured to receive the radiating part;

wherein, the radiating part is rotatablely fixed on the receiving section of the heat conductive part, when the radiating part rotates, fluid can be drawn into one end of the receiving section and then blown out at the other end by the blades.

The radiating part, in at least one embodiment, is rotatable and able to exchange heat constantly with new fluid (e.g. air or cold water). At the same time, the rotation of the blades can expel the fluid with higher temperature and draw in fluid with lower temperature to perform new heat exchange, accelerating the contact speed of the fluid and the surface of the blades of the radiating part, resulting in a better heat exchange rate.

In an embodiment, a rotating shaft is arranged on the radiating part, the blades extend from the inner surface of the housing to the rotating shaft. The rotating shaft is able to rotate the radiating part as well as the blades, with better stability.

In an embodiment, the radiator further comprises heat conductive fluid, the heat conductive fluid is in between the housing of the radiating part and the receiving section of the heat conductive part. Heat conductive fluid is adopted to diminish the thermal loss between the heat conductive part and the radiating part, resulting in a better heat conduction effect. At the same time, the airflow generated by the rotation of the radiating part is able to take off more heat thus improving the radiating effect.

In an embodiment, the heat conductive fluid is defined in between the housing of the radiating part and the receiving section of the heat conductive part by a sealed bearing, so that the heat conductive fluid would not leak out.

In an embodiment, the radiating part is fixed in the receiving section of the heat conductive part by a bearing. The bearing can be a sealed bearing or other kinds of bearings; the bearing is able to fix the radiating part in the receiving section, making sure there is a certain space between the radiating part and the receiving part, avoiding direct friction against each other.

In an embodiment, the radiator further comprises a power unit, the power unit is configured to rotate the radiating part, to better control the rotation of the radiating part.

In an embodiment, the radiator further comprises a power unit which is fixed with the rotating shaft of the radiating part, the power unit is configured to rotate the radiating part. The integral structure is more stable by when the rotating shaft is directly connected to the power unit, the power unit is able to rotate the housing and further rotate the blades.

In an embodiment, the radiator further comprises a holder which is configured to fix the power unit on the heat conductive part.

In an embodiment, heat pipes are buried inside of the shell of the heat conductive part to further improve the heat exchange rate.

At least one embodiment of the invention is further directed to an electric device.

In an embodiment, the electric device, includes a heat source, further including the radiator according to any of the above-mentioned embodiments, the radiator being in contact with the heat source through the heat conductive surface.

In an embodiment, the radiating part is able to rotate and exchange heat constantly with new fluid. At the same time, the rotation of the blades can expel the fluid with higher temperature and draw in fluid with lower temperature to perform new heat exchange, accelerating the contact speed of the fluid and the surface of the blades of the radiating part, resulting in a better heat exchange rate without extra occupied volume of the electric device.

FIGS. 1 through 4, discussed below, and the various embodiments used to describe the principles of the present disclosure in this patent document are by way of illustration only and should not be construed in any way to limit the scope of the disclosure. The numerous innovative teachings of the present application will be described with reference to example non-limiting embodiments.

The inventor of the present application finds out that in the heat dissipation system of the prior art, the efficiency of heat exchange is largely determined by the flow velocity of the air. The faster the air moves, the higher the heat exchange efficiency is, resulting in a better cooling effect. As shown in FIG. 1, cooling fins 92 would remain static because they are fixed under the heat source 90. Fans 91 would generate air flow while functioning which results in the fact that some cooling fins are close to the air passage while other cooling fins are far from the air passage. The air around those cooling fins which are close to the air passage moves faster thus leading to a higher heat exchange efficiency; the air around those cooling fins which are far from the air passage moves slower thus leading to a lower heat exchange efficiency. Therefore, the overall heat exchange of the heat dissipation system is unable to achieve the optimal efficiency. Meanwhile, to achieve better heat dissipation capability, the cooling fins are often large, making the volume of the electric device large accordingly.

The present application provides an embodiment of a radiator, comprising a radiating part and a heat conductive part, wherein, the heat generated by the heat source can be conducted to the radiating part by the heat conductive part, and the radiating part is able to rotate. When the radiating part rotates, fluid can be drawn into one end of and then blown out at the other end resulting in higher heat exchange efficiency.

In the embodiments of the present application, air is used as an example to illustrate how the radiator rotates and draws the fluid from one end then blows out the fluid from the other end. However, the specification should not be read as limiting the invention of the example air as described below, but to encompass other kinds of fluid such as cold water, fluid of room temperature, etc. The radiating part is able to draw in and discharge such fluid when rotating, thus cooling down the temperature.

Figure 2:
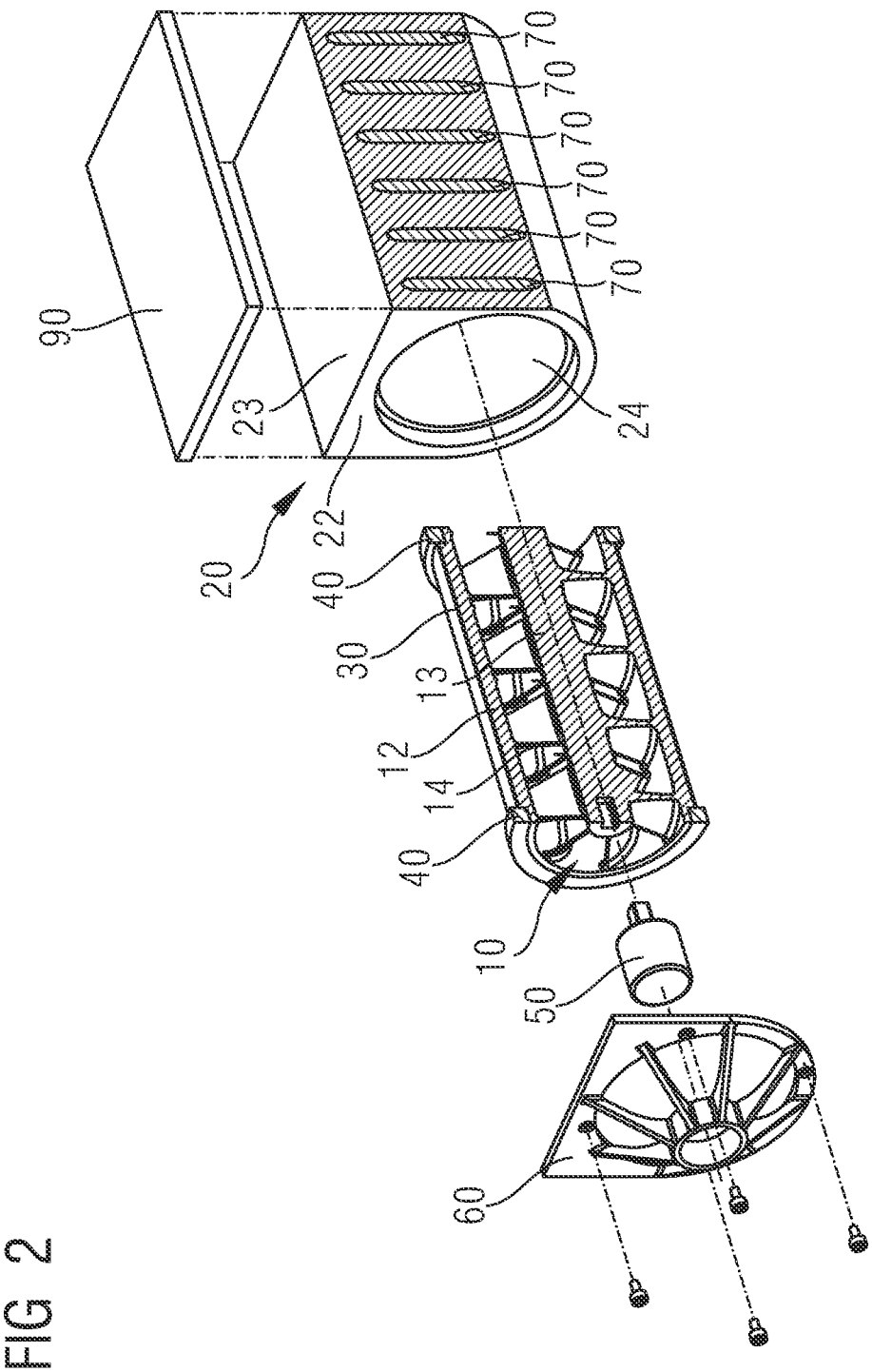
FIG. 2 illustrates an exploded view of a radiator of an example embodiment of the present invention.

As shown in the embodiment of FIG. 2, the radiating part 10 includes a housing 12 and a set of blades 14 arranged on the inner surface of the housing 12. When the housing 12 rotates, the blades 14 would rotate along with the housing 12, so that the air with lower temperature from outside can be drawn in.

The heat conductive part 20 has a shell 22. A heat conductive surface 23 which is in contact with the heat source 90 is arranged on the shell 22 so that the heat generated by the heat source can be conducted to the heat conductive part 20. Meanwhile, the heat conductive part 20 has a receiving section 24 with two open ends; the receiving section 24 can be approximately defined by the shell 22, so that the radiating part 10 can be put into the receiving section 24.

In this way, the radiating part 10 can be rotateably fixed in the receiving section 24 of the heat conductive part 20, a bearing 40 can be adopted to fix the radiating part 10 in the receiving section 24 so that there would be a certain space between the radiating part 10 and the receiving section 24, avoiding direct friction against each other while remaining fixed.

The heat conductive part 20 conducts heat to the radiating part 10 and further to the blades 14 by the air, when the radiating part 10 rotates, the air can be drawn into one end of the receiving section 24 and then blown out at the other end by the blades 14.

Heat conductive material 30 (e.g. silicone grease) as shown in the figure can also be applied in place of air. Heat conductive material 30 is of higher heat conducting efficiency and lower thermal loss. Heat conductive material 30 can be filled in between housing 12 of the radiating part 10 and the receiving section 24 of the heat conductive part 20, and then sealed by the bearing 40. Under such circumstances when heat conductive material 30 is adopted, the heat from the heat conductive part can be better conducted from the heat conductive part and further to the blades of the radiating part.

A power unit 50 which is capable of rotating the radiating part 10, for example, a motor, can be arranged on the heat conductive part 20 through a holder 60, so that the rotation of the radiating part 10 is in better control.

Figure 3:
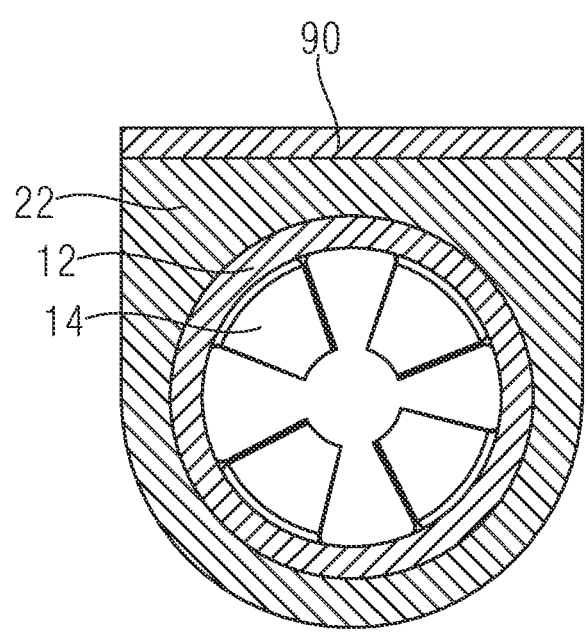
FIG. 3 illustrates a sectional view of a radiator of an example embodiment of the present invention.

FIG. 2 illustrates that a rotating shaft 13 is arranged inside of the radiating part 10 with the blades 14 extending from the inner surface of the housing 12 to the rotating shaft 13. Although the integral structure can be more stable by adopting the rotating shaft 13 as shown in FIG. 2, the rotating shaft 13 can be optional. As shown in FIG. 3, the blades 14 of the radiating part 14 protrude from the inner surface of the housing 12 without the rotating shaft being installed. The housing 12 includes a connecting part that connects the power unit (not shown in the figure), the power unit rotates the housing and further rotates the blades.

In the circumstance that blades are arranged between the rotating shaft and the inner surface of the housing, it is also possible to further arrange some blades on the inner surface of the housing protrudingly, or further arrange some blades on the rotating shaft, or further arrange some blades both on the inner surface of the housing protrudingly and on the rotating shaft.

Figure 4:
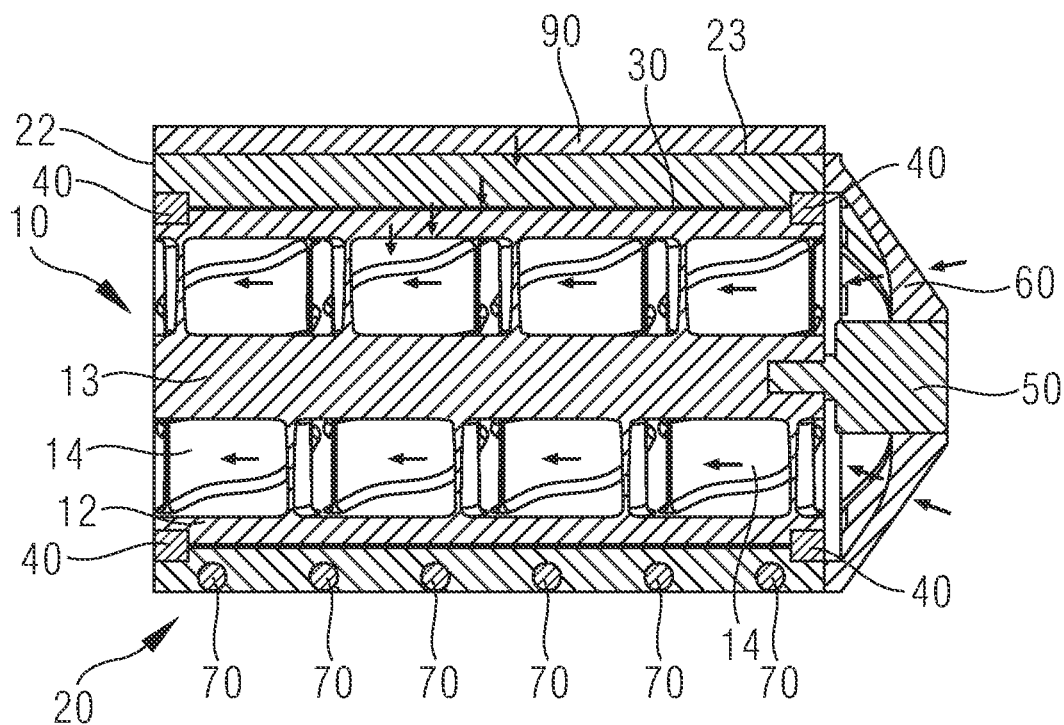
FIG. 4 illustrates a radiator at work of an example embodiment of the present invention.

To further improve the heat conductive efficiency, as shown in FIG. 2 and FIG. 4, heat spreading parts such as tubes 70 can be buried in the shell 22 of heat conductor 20.

As shown in FIG. 4, heat source 90 is in contact with the heat conductor 20 through the heat conductive surface 23; the heat is conducted from the shell 22 of the heat conductor 20 to the radiating part 10. The blades 14 are arranged on the housing 12 so that the heat can be conducted from the housing 12 to the blades 14, at the same time, the heat conductive material 30 can better conduct the heat on the heat conductor 20 further to the blades 14 of the radiating part 10. The rotating shaft 13 of the radiating part 10 is fixed to the power unit 50, the power unit 50 is able to rotate the radiating part 10, thus exchanging heat with new air constantly. It greatly accelerates the contact velocity of the air against the surface of the blades of the radiating part, thus improving the heat exchange efficiency.

The present invention also provides an electric device, including a heat source 90 generating heat, meanwhile, the above-mentioned radiator can be arranged, the radiating part is in contact with the heat source through the heat conductive surface so that the heat of the heat source can be conducted to the radiating part. The radiating part is able to rotate the fluid and exchange heat constantly with fluid with relatively lower temperature, resulting in a better heat exchange rate without extra occupied volume of the electric device, so that the radiator is relatively small.

Although an example embodiment of the present disclosure has been described in detail, those skilled in the art will understand that various changes, substitutions, variations, and improvements disclosed herein may be made without departing from the spirit and scope of the disclosure in its broadest form.

What is claimed is:
1. A radiator, comprising:
   a rotatable radiating part, including
      a housing, and
      a set of blades, arranged on an inner surface of the housing;
   a stationary heat conductive part, including:
      a shell, including a heat conductive surface configured to be in contact with a heat source, and
      a receiving section including two open ends, the receiving section being defined by the shell and being configured to receive the radiating part; and
   a heat conductive material, located in a gap between the housing of the radiating part and the receiving section of the heat conductive part,
      wherein, the radiating part is rotateably fixed on the receiving section of the heat conductive part, wherein, upon the radiating part rotating, the set of blades are configured to draw fluid into one of the two open ends of the receiving section and are configured to blow the fluid out another of the two open ends of the receiving section, and wherein the heat conductive material is defined over a length of the housing of the radiating part and the receiving section of the heat conductive part by a sealed bearing at each of the two open ends of the receiving section.

2. The radiator of claim 1, wherein, a rotating shaft is arranged on the radiating part, and wherein the blades are configured to extend from the inner surface of the housing to the rotating shaft.

3. The radiator of claim 1, wherein the radiating part is fixed in the receiving section of the heat conductive part by a bearing.

4. The radiator of claim 1, further comprising a power unit, configured to rotate the radiating part.

5. The radiator of claim 2, further comprising a power unit, fixed with the rotating shaft of the radiating part, configured to rotate the radiating part.

6. The radiator of claim 4, further comprising a holder, configured to fix the power unit on the heat conductive part.

7. The radiator of claim 1, wherein heat pipes are buried inside of the shell of the heat conductive part.

8. An electric device, comprising:
   a heat source; and
   the radiator of claim 1, the heat source being mounted on the heat conductive surface of the radiator.

9. The radiator of claim 5, further comprising a holder, configured to fix the power unit on the heat conductive part.

10. An electric device, comprising:
    a heat source; and
    the radiator of claim 2, the radiator being in contact with the heat source through the heat conductive surface.

11. An electric device, comprising:
    a heat source; and
    the radiator of claim 4, the radiator being in contact with the heat source through the heat conductive surface.

12. The radiator of claim 1, wherein the heat source is arranged on an exterior surface of the heat conductive surface of the shell.

13. The radiator of claim 1, wherein the heat conductive material is a heat conductive lubricant.

14. The radiator of claim 1, wherein the heat conductive material is a heat conductive grease.

15. The electronic device of claim 8, wherein the electronic device is a transistor.

16. The radiator of claim 1, wherein the heat source is mounted on a surface of the shell.

* * * * *